United States Patent
Evans et al.

(10) Patent No.: US 9,703,045 B2
(45) Date of Patent: Jul. 11, 2017

(54) SYSTEMS AND METHODS FOR LASER FREQUENCY STABILIZATION USING AN ARBITRARILY BIREFRINGENT RESONATOR

(71) Applicants: Matthew John Evans, Cambridge, MA (US); Adam Alexander Libson, Watertown, MA (US); Aaron Buikema, Cambridge, MA (US); Nicolas Brown, Cambridge, MA (US)

(72) Inventors: Matthew John Evans, Cambridge, MA (US); Adam Alexander Libson, Watertown, MA (US); Aaron Buikema, Cambridge, MA (US); Nicolas Brown, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/919,010

(22) Filed: Oct. 21, 2015

(65) Prior Publication Data
US 2016/0116678 A1    Apr. 28, 2016

Related U.S. Application Data

(60) Provisional application No. 62/067,149, filed on Oct. 22, 2014.

(51) Int. Cl.
*G02F 1/01* (2006.01)
*G02B 6/293* (2006.01)
(Continued)

(52) U.S. Cl.
CPC ........ *G02B 6/29395* (2013.01); *G01J 1/4257* (2013.01); *G02B 6/29302* (2013.01);
(Continued)

(58) Field of Classification Search
None
See application file for complete search history.

(56) References Cited

U.S. PATENT DOCUMENTS 3,588,738 A    6/1971   Goodwin
3,628,173 A *  12/1971  Danielmeyer ........ H01S 3/1398
                                              372/103
(Continued)

FOREIGN PATENT DOCUMENTS

WO    WO 2007/138632 A1    12/2007

OTHER PUBLICATIONS

Asenbaum, P. et al., "Cavity stabilization using the weak intrinsic birefringence of dielectric minors," Opt. Lett., vol. 36, No. 19. (Oct. 1, 2011), pp. 3720-3722.
(Continued)

*Primary Examiner* — Sung Pak
(74) *Attorney, Agent, or Firm* — Cooley LLP

(57) ABSTRACT

Systems and methods to stabilize a laser frequency include a birefringent resonator that introduces an arbitrary phase difference between two polarization components of the laser beam, a polarizing beam splitter to separate the two polarization components after the birefringent resonator, and a differential detector to monitor the separated two polarizations, based on which an error signal can be produced to control a servo to adjust the laser frequency or resonator resonance frequency accordingly. The birefringent resonator can comprise a fiber ring, a whispering gallery mode (WGM) resonator, or any other birefringent ring resonator. A servo can be included in the systems and methods to lock the laser frequency to the resonant frequency of the birefringent resonator or to lock the resonator resonant fre-
(Continued)

quency to the laser frequency. One or more polarization controllers can also be employed to adjust the polarization state of the laser beam.

20 Claims, 10 Drawing Sheets

(51) Int. Cl.
    G01J 1/42          (2006.01)
    H01S 3/00         (2006.01)
    H01S 3/13         (2006.01)
    G02B 6/27         (2006.01)

(52) U.S. Cl.
    CPC .......... *G02B 6/29341* (2013.01); *H01S 3/005* (2013.01); *H01S 3/1305* (2013.01); *G02B 6/2706* (2013.01)

(56) References Cited

U.S. PATENT DOCUMENTS

| | | | |
|---|---|---|---|
| 4,451,923 A | 5/1984 | Hansch et al. | |
| 4,530,603 A | 7/1985 | Shaw et al. | |
| 5,107,511 A * | 4/1992 | Nakatani | H01S 3/137 372/29.021 |
| 5,107,512 A | 4/1992 | Shibutani | |
| 5,717,708 A | 2/1998 | Mells | |
| 6,661,941 B1 | 12/2003 | Yao | |
| 7,801,189 B2 * | 9/2010 | Maleki | H01S 3/1305 359/239 |
| 8,164,816 B1 | 4/2012 | Savchenkov et al. | |
| 9,097,526 B1 | 8/2015 | Sanders et al. | |
| 2013/0271770 A1 | 10/2013 | Sanders et al. | |

OTHER PUBLICATIONS

Boon-Engering, J. M., "Stabilization of an optical cavity containing a birefringent element," Opt. Commun., vol. 140, (1997), pp. 285-288.
Boleininger, A. et al., "Whispering Gallery Modes in Standard Optical Fibres for Fibre Profiling Measurements and Sensing of Unlabelled Chemical Species", Sensors, vol. 10, (2010), pp. 1765-1781.
Brinkman, W. F. et al., "The Lasers Behind the Communications Revolution," Bell Labs Techn. J., vol. 5, (Jan.-Mar. 2000), pp. 150-167.
Chen, C.-L. et al., "Polarization Characteristics of Single-Mode Fiber Couplers," IEEE Trans. Microwave Theory Tech., vol. MITT-30, No. 10, (Oct. 1982), pp. 1577-1588.
Cole, G. D. et al., "Tenfold reduction of Brownian noise in high-reflectivity optical coatings," Nature Photon., vol. 7, (Aug. 2013), pp. 644-650.
Drever, R. W. P. et al., "Laser Phase and Frequency Stabilization Using an Optical Resonator," Appl. Phys. B., vol. 31, (1983), pp. 97-105.
Frazao, O. et al., "Recent Advances in High-Birefringence Fiber Loop Mirror Sensors", Sensors, vol. 7, (2007), pp. 2970-2983.
Gagliardi, G. et al., "Interrogation of fiber Bragg-grating resonators by polarization-spectroscopy laser-frequency locking," Opt. Express, vol. 15, (2007), pp. 3715-3728.
Hänsch, T. et al., "Laser frequency stabilization by polarization spectroscopy of a reflecting reference cavity," Opt. Commun., vol. 35, (1980), pp. 441-444.
Harvey, M. D. et al., "Frequency locking by analysis of orthogonal modes," Opt. Commun., vol. 221, (2003), pp. 163-171.
Honda, Y. et al., "Stabilization of a non-planar optical cavity using its polarization property," Opt. Commun., vol. 282, (2009), pp. 3108-3112.
Ippen, E. "Stimulated Brillouin scattering in optical fibers," Appl. Phys. Lett., vol. 21, No. 11, (1972), pp. 539-541.

Iwatsuki, K. et al., "Eigenstate of polarization in a fiber ring resonator and its effect in an optical passive ring-resonator gyro," Appl. Opt., vol. 25, (1986), pp. 2606-2612.
Kessler, T. et al., "A sub-40-mHz-linewidth laser based on a silicon single-crystal optical cavity," Nature Photon., vol. 6, (Oct. 2012), pp. 687-692.
Lamouroux, B. et al., "Polarization effect in optical-fiber ring resonators," Opt. Lett. vol. 7, No. 8, (Aug. 1982), pp. 391-393.
Lee, B., "Review of the present status of optical fiber sensors", Optical Fiber Technology, vol. 9, No. 2, (Apr. 2003), pp. 57-79.
Lefevre, H. C. et al., "All-fiber gyroscope with inertial-navigation short-term sensitivity," Opt. Lett., vol. 7, No. 9, (Sep. 1982), pp. 454-456.
Merrer, P.-H. et al., "Laser stabilization on a fiber ring resonator and application to RF filtering," IEEE Photon. Technol. Lett., vol. 20, No. 16, (Aug. 15, 2008), pp. 1399-1401.
Miller, J. et al., "Length control of an optical resonator using second-order transverse modes," Opt. Lett., vol. 39, No. 8, (2014), pp. 2495-2498.
Moriwaki, S. et al., "Frequency discrimination method making use of polarization selectivity of triangular optical cavity," Appl. Phys. Express, vol. 2, (2009), pp. 016501-1 to 016501-3.
Paul, T. J. et al., "Narrow-linewidth diode laser using a fiber-optic ring resonator," Opt. Lett., vol. 18, No. 15, (Aug. 1, 1993), pp. 1241-1243.
Pound, R. V., "Electronic frequency stabilization of microwave oscillators," Rev. Scientific Instrum., vol. 17, No. 11, (Nov. 1946), pp. 490-505.
Righini, G. C. et al., "Whispering gallery mode microresonators: Fundamentals and applications", Rivista Del Nuovo Cimento, Societa Italiana di Fisica, vol. 34, N. 7, (Mar. 2011), pp. 435-488.
Robins, N. P. et al., "Interferometric, modulation-free laser stabilization", Optics Letters, vol. 27, No. 21, (Nov. 1, 2002), pp. 1905-1907.
Ostermeyer, M. et al., "Diode-pumped Nd:YAG master oscillator power amplifier with high pulse energy, excellent beam quality, and frequency-stabilized master oscillator as a basis for a next-generation lidar system," Appl. Opt., vol. 44,No. 4, (2005), pp. 582-590.
Schliesser, A. et al., "Resolved-sideband cooling of a micromechanical oscillator," Nature Phys., vol. 4, (May 2008), pp. 415-419.
Seraji, F. E. et al., "Comparative Analysis of Optical Ring Resonators with Cross-and Direct-Coupled Configurations", International Journal of Optics and Applications, vol. 2, No. 3, (2012), pp. 15-19.
Shaddock, D. A. et al., "Frequency locking a laser to an optical cavity by use of spatial mode interference," Opt. Lett., vol. 24, No. 21 (1999), pp. 1499-1501.
Stokes, L. F. et al., "All-single-mode fiber resonator", Optics Letters, Vo. 7, No. 6, (Jun. 1982), pp. 288-290.
Strekalov, D. V., et al., "Temperature measurement and stabilization in a birefringent whispering gallery mode resonator," Opt. Express, vol. 19, No. 15 (Jul. 13, 2011), pp. 14495-14501.
Wang, W. et al., "The characterizations of polarization in resonator integrated optic gyroscope," Opt. Quantum Electron., vol. 42, (2011), pp. 313-325.
Xiao-Guang, Z. et al., "The number of least degrees of freedom required for a polarization controller to transform any state of polarization to any other output covering the entire Poincaré sphere," Chin. Phys. B, vol. 17, (2008), pp. 2509-2513.
Yao, S., "Polarization in Fiber Systems: Squeezing out More Bandwidth", General Photonics Corp., Reprinted from the 2003 issue of the Photonics Handbook, Laurin Publishing, (2003), 5 pages.
Yoshikawa, Y. et al., "Frequency stabilization of a laser diode with use of light-induced birefringence in an atomic vapor", Applied Optics, vol. 42, No. 33, Nov. 2003, pp. 6645-6649.
Zhang, F. et al., "Direct-coupling single-mode fiber ring resonator," J. Opt. Soc. Am. A. vol. 5, No. 8, (Aug. 1988), pp. 1347-1355.
International Search Report and Written Opinion mailed Feb. 23,

(56) References Cited

OTHER PUBLICATIONS 2016 from corresponding International Application No. PCT/US15/56628.

* cited by examiner

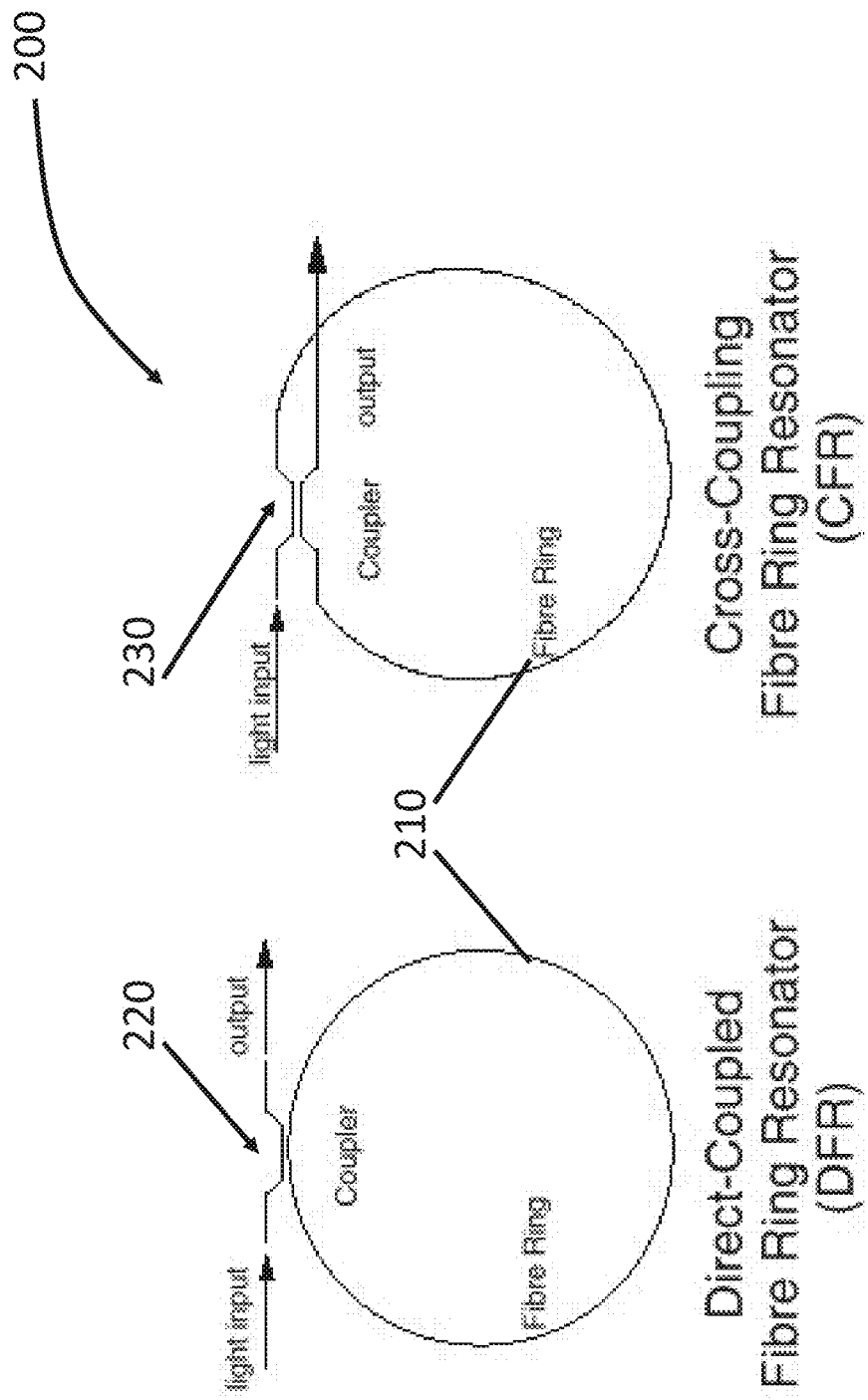
FIG. 2A Direct-Coupled Fibre Ring Resonator (DFR)
FIG. 2B Cross-Coupling Fibre Ring Resonator (CFR)

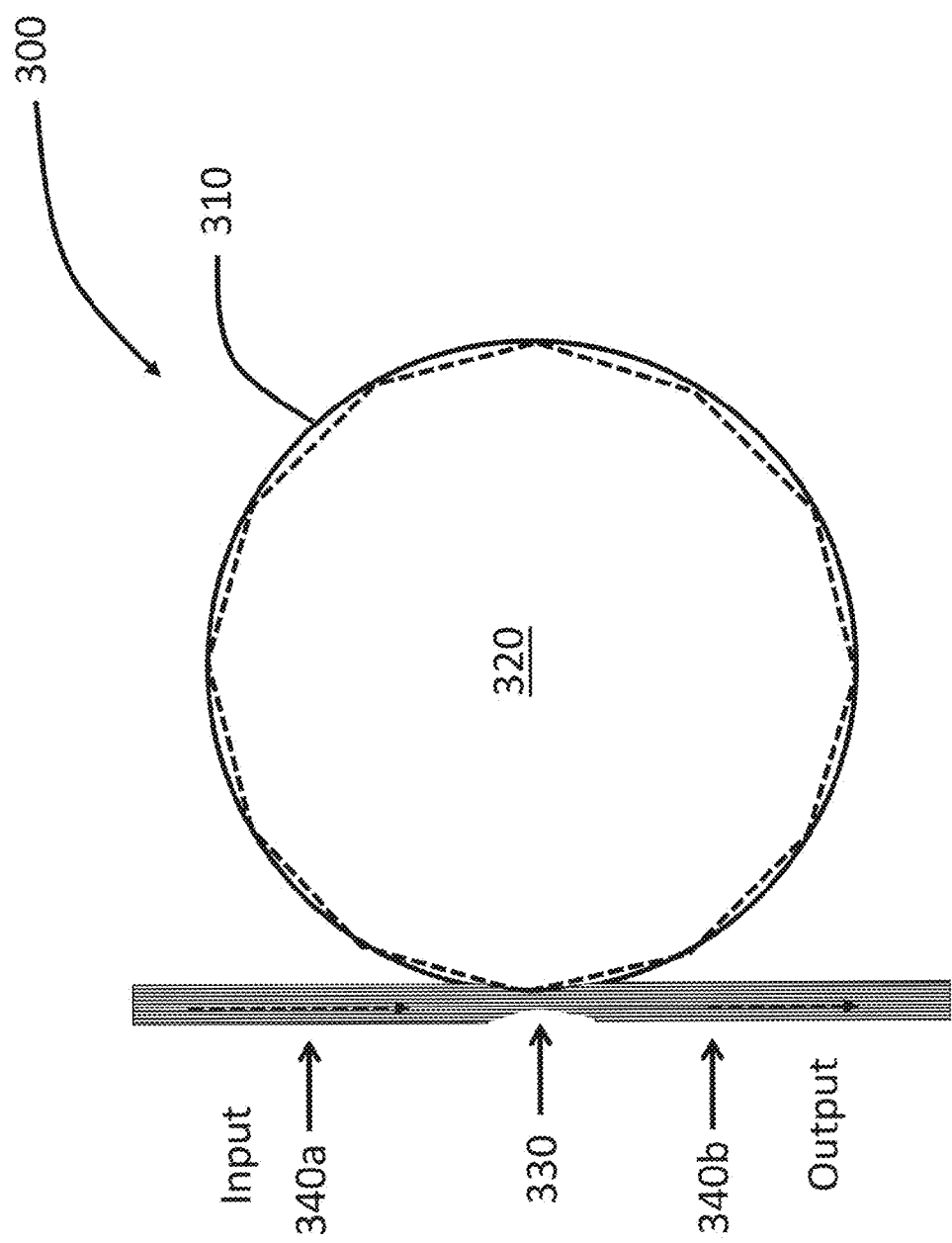

SYSTEMS AND METHODS FOR LASER FREQUENCY STABILIZATION USING AN ARBITRARILY BIREFRINGENT RESONATOR

CROSS-REFERENCE TO RELATED APPLICATION(S)

This application claims priority, under 35 U.S.C. §119(e), from U.S. Application No. 62/067,149, filed Oct. 22, 2014, and entitled "Systems and Methods for Laser Frequency Stabilization Using an Arbitrarily Birefringent Resonator," which application is hereby incorporated herein by reference in its entirety.

GOVERNMENT SUPPORT

This invention was made with Government support under Grant No. PHY0757058 awarded by the National Science Foundation. The Government has certain rights in the invention.

BACKGROUND

Lasers that emit light at a stable frequency with a narrow linewidth can find applications in a variety of areas. For example, next generation atomic clocks based on optical rather than microwave transitions can benefit from stable laser sources that can accurately probe the sub-Hertz linewidths available in laser-cooled samples. Laser systems with narrow linewidths and low frequency and amplitude noise may also help the search for gravitational waves (e.g., Advanced LIGO) by providing a stable phase reference.

The linewidth of an unstabilized or "free-running" laser, which is related to the short-term (e.g., less than millisecond) stability, is often too large for such high-precision applications. Linewidths of free-running lasers can be a few kilohertz, which is far above the Schawlow-Townes limit, a quantum limit for the linewidth of a laser. Various sources of technical noise, including but not limited to fluctuations of the resonator length, the pump power, and the temperature of the laser, can contribute to increased linewidth. Semiconductor lasers, which are widely utilized in fields spanning engineering, biology, chemistry, and medicine, may have linewidths in the megahertz range, and the linewidths can increase above the Schawlow-Townes limit by amplitude-phase coupling or charge carrier fluctuations.

To stabilize the frequency of a laser, an external passive cavity with a set of resonant frequencies can be used. The laser frequency can be compared to a resonant frequency of the cavity in real-time and, using a feedback loop, the laser frequency can be adjusted when the two frequencies are not equal. At present, however, there are no electronics fast enough to measure such a frequency difference directly. Instead, the frequency difference information is typically extracted from other signals for laser frequency stabilization.

One way to stabilize a laser frequency is the Pound-Drever-Hall (PDH) locking technique, in which a portion of the output light from a laser source is phase modulated and sent to an external cavity that has a set of resonant frequencies. The reflected beam from the external cavity contains information about the difference between the laser frequency and a cavity resonant frequency. This information can be extracted by mixing the reflected beam power signal with the drive signal for the phase modulation and feeding the resulting beat signal into a servo to appropriately adjust the laser frequency. In this way, the laser frequency can be locked to the resonant frequency of the external cavity. PDH locking is widely used, but the bandwidth of the feedback is intrinsically limited by the modulation frequency. Because high speed modulators are generally expensive, the overall apparatus for high-performance frequency stabilization using PDH locking can be costly.

Another technique for laser frequency stabilization is Hansch-Couillaud (HC) locking, which uses polarization spectroscopy in connection with an external cavity. The external cavity contains a polarizer, which allows only one polarization mode to resonate in the cavity. In HC locking, the cavity is positioned to receive a laser beam linearly polarized at an angle with respect to the polarizer axis so that one polarization component of the light is directly reflected as a reference, while the other polarization component enters the cavity and passes through the polarizer in the cavity. The resonant polarization component experiences a frequency-dependent phase change relative to the polarization component used as a reference, creating an elliptically polarized reflected beam. The phase change can then be detected by a polarization analyzer whose output indicates the amount of frequency deviation from the cavity resonance and can provide an error signal for frequency stabilization. Although free of modulation, the HC method suffers from other drawbacks. For example, the intracavity polarizer introduces losses even for light polarized along its polarization axis.

SUMMARY

To eliminate unnecessary losses and enable effective implementation of laser frequency stabilization, exemplary embodiments take advantage of the otherwise detrimental arbitrary birefringence found in optical fibers or other materials and introduce a frequency-dependent phase difference into the two polarization components of a laser beam.

In one exemplary embodiment, a system to generate a signal representative of a laser frequency includes a birefringent resonator with arbitrary and/or unknown birefringence to introduce a frequency-dependent phase difference into two polarization components of the laser beam, a polarizing beam splitter (PBS) to separate the two polarization components, and a differential detector to produce the signal based at least in part on the phase difference between the two polarization components. In one non-limiting example, the birefringent resonator comprises a fiber ring that includes a length of fiber formed into a closed ring and connected to input and output fibers by a coupler. In another non-limiting example, a whispering gallery mode (WGM) resonator is employed as the birefringent resonator. In yet another example, the birefringent resonator utilizes cavities formed with crystal-coated mirrors to introduce the frequency-dependent phase difference. All the components can be coupled together with fibers so as to provide a compact all-fiber system.

The system can further include a servo, which takes the signal produced by the differential detector as an input and adjusts the laser frequency according to a preset frequency depending on the resonant frequency of the birefringent resonator. Alternatively, the signal produced by the detector can be sent to a servo that adjusts the resonant frequency of the resonator depending on the laser frequency. The system can also include one or more polarization controllers to adjust the polarization state of the laser beam before the birefringent resonator and/or the polarizing beam splitter that follows the resonator.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 2A and 2B show different arbitrarily birefringent fiber ring resonators that can be employed in a laser frequency stabilization system like the one shown in FIG. 1B.

FIGS. 3A-3C show different arbitrarily birefringent Whispering Gallery Mode (WGM) resonators that can be employed in a laser frequency stabilization system like the one shown in FIG. 1B.

DETAILED DESCRIPTION

Figure 1A:
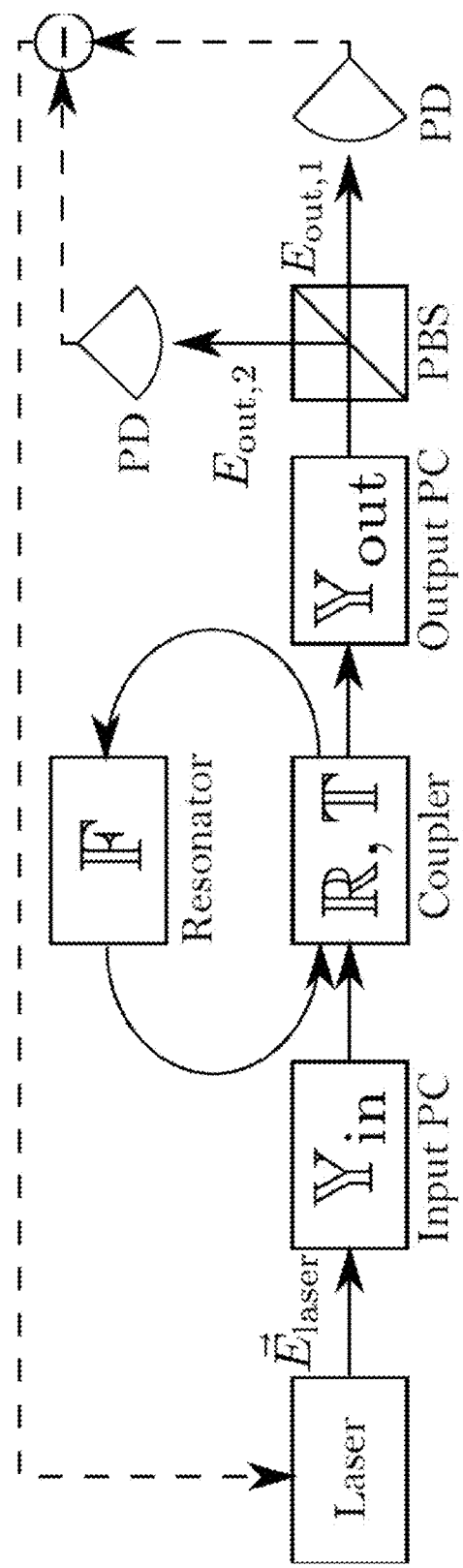
FIG. 1A is a block diagram of a frequency-stabilization system that uses a resonator with an unknown and/or arbitrary birefringence to generate an error signal for stabilizing the frequency of a laser.

Most optical resonators can have some effect on the polarization of circulating light. Without being bound by any theory or mode of operation, a birefringent cavity imparts a different phase delay to each eigenpolarization of the cavity and may alter the polarization of the input light. Additionally, cavity losses may be polarization dependent, which can create additional polarization effects. These polarization effects can be more easily understood by representing the electric field of fully polarized light as a two-component complex vector known as a Jones vector. Conventionally, this vector is written using linear horizontal and vertical polarizations as the basis, so a polarized plane light wave at time t and distance z along the propagation axis has the form:

$$\vec{E} = \begin{pmatrix} E_H \\ E_V \end{pmatrix} = \begin{pmatrix} A_H \\ A_V e^{i\phi} \end{pmatrix} e^{i(\omega t - kz)}, \quad (1)$$

where $A_H$ and $A_V$ are the amplitudes of each polarization component, $\phi$ is the phase difference between each component, i is the imaginary unit defined by $i^2=-1$, and $\omega$ and k are the angular frequency and wave number of the light, respectively. The physical electric field components are given by the real part of the vector in (1). The last exponential is usually dropped since global phases may have little to no effect on the polarization state. In this framework, cavity losses, polarization transformations, and phase changes can be described by a 2×2 Jones matrix that acts on the polarization vector. For example, in this basis the Jones matrix for a half-wave plate with a fast axis at angle $\theta$ relative to the horizontal is:

$$\begin{pmatrix} \cos 2\theta & \sin 2\theta \\ \sin 2\theta & -\cos 2\theta \end{pmatrix}. \quad (2)$$

In what follows, as an illustrative and non-limiting example, consider the polarization effects of a fiber ring resonator with a single input coupler. This example is generalizable to any birefringent cavity. The amplitude transmittance and reflectance matrices of the input coupler are labelled T and R, respectively. Let F be the matrix that represents the polarization transformation as the light propagates through the fiber ring. Included in this matrix is information about the overall (polarization- and frequency-dependent) phase picked up in a single trip through the ring and any losses.

Let $E_{in}$ and $E_{refl}$ be the cavity input and reflected polarization vectors, respectively. The total cavity amplitude reflectivity matrix $R_{cav}$, defined by $E_{refl}=R_{cav}E_{in}$, is given by:

$$R_{cav}=R-TF(1-RF)^{-1}T, \quad (3)$$

where I is the identity matrix. Since RF represents one round trip of the resonator, the two eigenvectors of this matrix are the eigenpolarizations of the resonator. For positive real eigenvalues of RF, light will resonate.

Assume that the eigenvectors of RF are also eigenvectors of T and R, and therefore of $R_{cav}$, for all (relevant) frequencies $\omega$. This assumption holds for input optics with polarization-independent properties or, in cases where the cavity has well-defined fast and slow axes, when the input optics are aligned with these axes. For fibers, the polarization effects of the couplers are often much smaller than the effects due to birefringence in the fiber itself, so this is a reasonable assumption for fiber rings. In this case, the eigenvalues of $R_{cav}$ are given by $$r_{cav}^j(\omega) = r_j - \frac{t_j^2 f_j(\omega)}{1 - r_j f_j(\omega)}, \quad (4)$$

where $t_j$, $r_j$, and $f_j$ are the eigenvalues of the $j^{th}$ eigenpolarization under T, R, and F, respectively.

In general, $f_j = \alpha_j \exp(ik_j p)$, where $k_j = 2\pi n_j \nu/c$ is the wavenumber for each eigenpolarization, $n_j$ is the effective index of refraction for each eigenpolarization, $\nu$ is the frequency of light, $p$ is the distance the light travels in one round trip of the cavity, and $\alpha_j$ is a complex term that accounts for losses in the cavity and additional phase shifts not due to propagation. Near resonance, the reflected light undergoes a very large phase shift. Without being bound by any theory, the sharp change in the imaginary component near resonance can originate from the phase shift.

In general, the wavenumbers for different eigenpolarizations will not be equal, so there will be a difference in the phase accumulated by each eigenpolarization after one round trip, resulting in two longitudinal modes that are on resonance for different $\omega$. As one eigenpolarization moves through a resonance, it undergoes a large phase shift on reflection, while the other eigenpolarization does not. In this manner, the latter can be used as a phase reference for the former.

It is helpful to have these resonances shifted sufficiently far in frequency to be individually resolved. Individual resonance peaks may be separated for round trip phase differences between eigenpolarizations $\Delta\theta$ that satisfy:

$$\Delta\theta \bmod 2\pi > \frac{2\pi\Delta\nu}{FSR} \tag{5}$$

and $$-\Delta\theta \bmod 2\pi > \frac{2\pi\Delta\nu}{FSR}, \tag{6}$$

where $\Delta\nu$ is the full width at half maximum of the cavity resonance and FSR is the free spectral range. Thus, this method can be used even in cavities with small birefringence so long as the cavity has a large finesse. Note that the wide separation of resonances can be compromised in practice, i.e., this method can be carried out even if the peaks are not completely resolved.

To use the birefringence of the resonator to produce an error signal, light travelling to the resonator must first be put into the correct input polarization, which can be done using a polarization controller (PC). There are many ways to implement such a device, but a common arrangement consists of a quarter-wave plate, a half-wave plate, and a second quarter-wave plate, each of which can be rotated independently. These polarization controllers can map an arbitrary input polarization state to any other polarization state. After reflecting from the resonator, light goes through another PC before propagating to a polarizing beam splitter (PBS) with a photodetector (PD) at each output. With the correct polarization control settings before and after the cavity, the difference in power at the two output ports of the PBS produces an error signal for the resonance condition of the cavity. Expressed in the Jones matrix formalism, the error signal $\Delta$ is proportional to $$\Delta = |E_{out,2}|^2 - |E_{out,1}|^2, \tag{7}$$

where $$E_{out,1} = \begin{pmatrix} 1 \\ 0 \end{pmatrix} \cdot Y_{out} \mathbb{R}_{cav} Y_{in} \vec{E}_{laser} \tag{8}$$

$$E_{out,2} = \begin{pmatrix} 0 \\ 1 \end{pmatrix} \cdot Y_{out} \mathbb{R}_{cav} Y_{in} \vec{E}_{laser}$$

are the respective projections of the final electric field amplitude onto the PBS polarization basis states. The proportionality constant will depend on the PD gain. In the above equations, $Y_{in(out)}$ is the Jones matrix of the input (output) PC and $\mathbb{R}_{cav}$ is the cavity amplitude reflectivity matrix given by equation (3).

We further assume the cavity eigenpolarizations are orthogonal. This will be true for cavities with polarization-independent losses, in which R, T, and F are all unitary matrices multiplied by a constant loss term. The eigenpolarizations will also be orthogonal for cavities in which one polarization mode is completely extinguished in the cavity, as in the original HC method. In practice, this approximation holds true for most single-mode fiber rings.

Let $E_a$ and $E_b$ be the normalized eigenpolarizations of RF. The input PCs can be set so that the input polarization is an equal superposition of these eigenpolarizations:

$$\vec{E}_{in} = Y_{in} \vec{E}_{laser} = \frac{E_0}{\sqrt{2}} (\vec{E}_a + e^{i\gamma} \vec{E}_b), \tag{9}$$

where $E_0$ is the amplitude of the electric field and $\gamma$ is the phase difference between eigenpolarization components. The reflected light will be in the polarization state:

$$\vec{E}_{ref1} = \mathbb{R}_{cav} \vec{E}_{in} = \frac{E_0}{\sqrt{2}} (\mathbb{R}_{cav} \vec{E}_a + e^{i\gamma} \mathbb{R}_{cav} \vec{E}_b) \tag{10}$$

$$= \frac{E_0}{\sqrt{2}} (r^a_{cav}(\omega) \vec{E}_a + e^{i\gamma} r^b_{cav}(\omega) \vec{E}_b).$$

Because the polarization controllers can map an arbitrary input state to any given output polarization state, there exists an arrangement of the output polarization controller that maps one eigenpolarization to an equal superposition of the PBS polarizations:

$$\vec{E}_a \mapsto Y_{out} \vec{E}_a = \frac{1}{\sqrt{2}} \begin{pmatrix} 1 \\ e^{i\delta} \end{pmatrix} \tag{11}$$

in the PBS basis for some $\delta$. The polarization controller produces a lossless, and therefore unitary, transformation on the Jones vector, so the other eigenpolarization will be mapped to a final polarization state orthogonal to this with some relative phase shift $\phi$:

$$\vec{E}_b \mapsto Y_{out} \vec{E}_b = \frac{e^{i\phi}}{\sqrt{2}} \begin{pmatrix} -1 \\ e^{i\delta} \end{pmatrix}. \tag{12}$$

The final polarization state in the PBS basis is then $$\vec{E}_{out} = Y_{out} \vec{E}_{ref1} = \frac{E_0}{2} \left( r^a_{cav}(\omega) \begin{pmatrix} 1 \\ e^{i\delta} \end{pmatrix} + e^{i(\gamma+\phi)} r^b_{cav}(\omega) \begin{pmatrix} -1 \\ e^{i\delta} \end{pmatrix} \right) \tag{13}$$

and the sum and difference of the photodiode signal are proportional to:

$$|E_{out,1}|^2 + |E_{out,2}|^2 = \frac{E_0^2}{2}(|r_{cav}^a(\omega)|^2 + |r_{cav}^b(\omega)|^2) \quad (14)$$

and $$|E_{out,2}|^2 - |E_{out,1}|^2 = E_0^2 \text{Re}\{(r_{cav}^a(\omega))^* r_{cav}^b(\omega) e^{i(\gamma+\phi)}\}, \quad (15)$$

respectively. Re denotes the real part and * represents complex conjugation. Equation (15) forms the error signal.

In the case of widely separated resonances, near the resonance of one eigenpolarization the imaginary part of the cavity reflectivity undergoes a sharp change, while the reflectivity for the other eigenpolarization changes very little. By adjusting the additional phase term in equation (15), the steep imaginary part of the individual reflection coefficients can be extracted. For widely separated resonances, this occurs for $\gamma+\phi \approx \pm \pi/2$. The output polarization controllers vary $\phi$ to produce an ideal error signal; therefore, it is not necessary to know or control $\gamma$. This means that the input polarization state can be chosen without regard to the relative phases of the eigenpolarizations, and that only the sum signal is needed to set the input PCs.

This is a general method for producing an error signal for a birefringent resonator with two longitudinal modes; for a chosen input polarization satisfying (9), one can find a physically realizable Jones matrix $Y_{out}$ that produces an error signal.

Error Signal Generation using Resonators with Arbitrary Birefringence

FIG. 1A shows a block diagram of a system to generate an error signal that is representative of a laser frequency and can be used for laser frequency stabilization. A laser beam from a laser source can be transmitted through an input polarization controller (PC) to adjust its polarization state via a transformation matrix $Y_{in}$. A coupler, with reflection matrix R and transmission matrix T, can couple the laser beam into a birefringent resonator with arbitrary and/or unknown birefringence. A single trip through the resonator can change the laser beam polarization via a transformation matrix F. The output beam from the resonator contains information regarding the difference between the laser frequency and a resonance frequency of the resonator. An output PC, with transformation matrix $Y_{out}$, can then map the polarization state of the output beam to a PBS that can separate the two polarization components of the laser beam and facilitate generating the error signal.

Figure 1B:
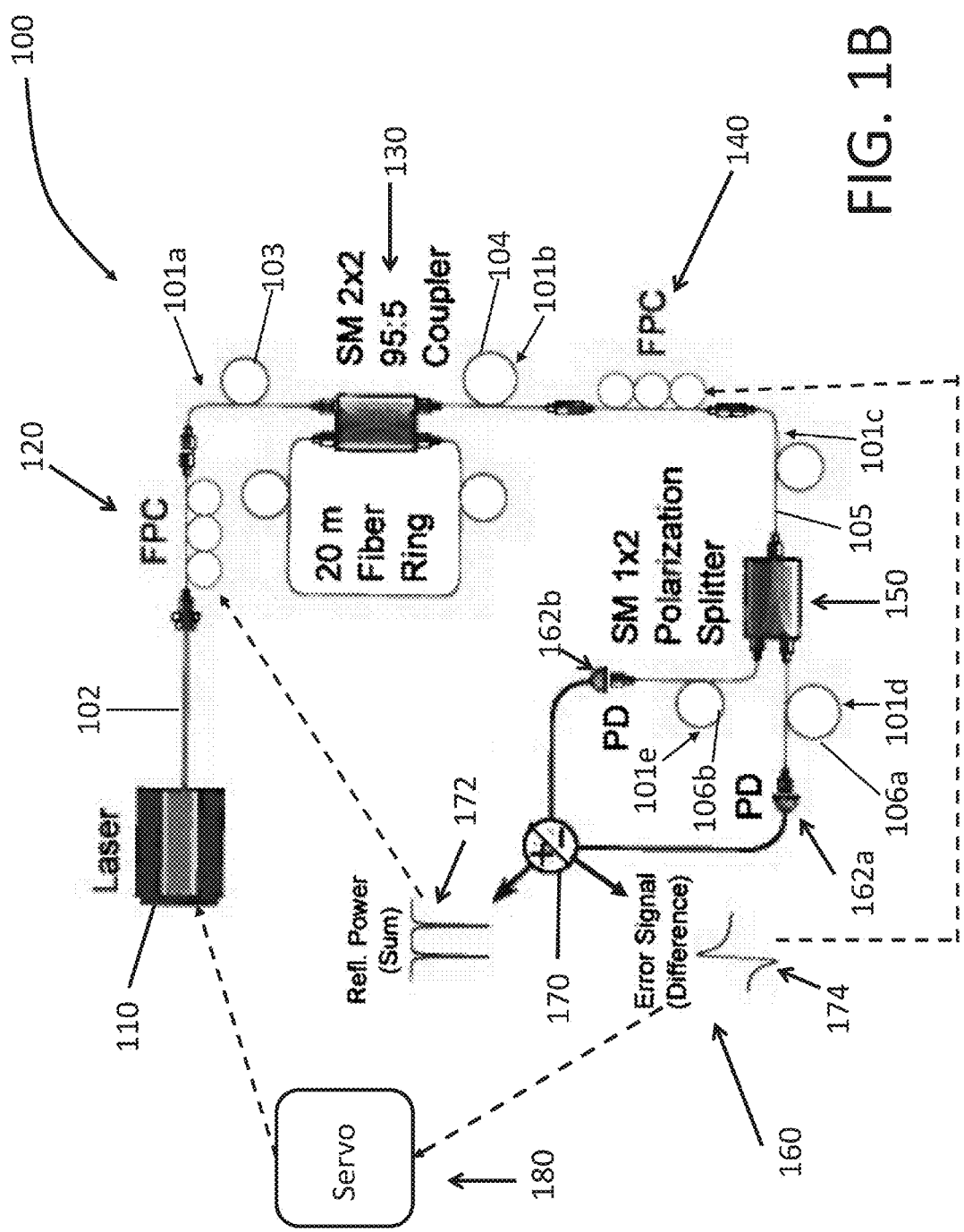
FIG. 1B shows a system to generate a signal representative of a frequency of a laser beam according to one exemplary embodiment.

FIG. 1B shows an exemplary system 100 for laser frequency stabilization using birefringence to produce a frequency error signal. The system 100 includes a laser source 110, a first polarization controller 120, a resonator 130 that has arbitrary and/or unknown birefringence, a second polarization controller 140, a polarizing beam splitter (PBS) 150, a detector 160, and a servo 180. The detector 160 may comprise a pair of photodetectors 162a and 162b (collectively, photodetectors 162) and an operational amplifier 170 to produce a signal based at least in part on the difference between the detection signals from the two photodetectors 162. These components can be discrete components that act on free-space beams, connected together by optical fibers 101a-101e (collectively, optical fibers 101) or other waveguides, and/or integrated in or on a semiconductor substrate.

The laser source 110 emits a laser beam 102 that can be sent into the first polarization controller 120 to map its polarization state into another polarization state before being sent into the birefringent resonator 130. If desired, this laser beam 102 may be polarized (e.g., in a linear polarization state). As mentioned above, a single roundtrip through the birefringent resonator 130 can effect an arbitrary, and often unknown, polarization transformation to the incident light. In fact, the birefringence of this birefringent resonator 130 need not be measured or known to produce a suitable error signal.

The birefringent resonator 130 has two eigenpolarization states which are orthogonal to each other. In one example, the first polarization controller 120 can convert the polarization state of the laser beam 102 into a substantially equal superposition of the two eigenpolarization states of the birefringent resonator 130. In another example, the birefringent resonator 130 itself may be oriented in such a way that the original polarization state of the laser beam 102 can be decomposed equally into the two eigenpolarization states of the birefringent resonator 130. In either case, the polarization state of the laser beam 103 upon entering the birefringent resonator 130 can be adjusted to produce a superposition of the two eigenpolarization states of the resonator.

In operation, the two eigenpolarization states of the birefringent resonator 130 generally have two different wavenumbers k. Therefore, when a beam that can be decomposed into two eigenpolarization states is propagating in the resonator, each component accumulates a different phase retardation after one round trip through the resonator, resulting in two longitudinal modes that are on resonance with different frequencies. As one eigenpolarization state moves through a resonance, it can undergo a large phase shift upon reflection from the resonator, but the other eigenpolarization state changes very little. In this manner, the latter can be employed as a phase reference for the former to produce an error signal that contains information about the frequency-dependent phase difference accumulated by the two eigenpolarization states. Practically, a large separation between resonance peaks can benefit the error signal production since it can be easier to tune one eigenpolarization state into resonance but not the other, therefore allowing the off-resonance eigenpolarization state to serve as a reference for the resonant one.

Without being bound by any particular theory, individual resonance peaks can be separated if the phase difference $\Delta\theta$ accumulated by the two eigenpolarization states in one round trip satisfies Equations (5) and (6). To satisfy Equations (5) and (6) and therefore separate the resonance peaks, it is possible to either increase the birefringence of the birefringent resonator 130 in order to increase the round-trip phase difference $\Delta\theta$, to increase the finesse of the birefringent resonator 130, or both.

The laser beam 104 at the output of the birefringent resonator 130 contains information about the frequency difference between the laser frequency and the resonant frequency of the birefringent resonator 130. To extract this information, the laser beam 104 may be sent into the PBS 150 to separate one polarization component from the other. The polarizing beam splitter can also have two orthogonal eigenpolarization states. In one example, the laser beam 104 is transmitted through the second polarization controller 140 before being sent to the polarizing beam splitter 150. The second polarization controller can convert the laser beam 104 into laser beam 105 that has a different polarization state, including a state that is substantially an equal superposition of the two eigenpolarization states of the polarizing beam splitter 150. In another example, the polarizing beam splitter may be oriented in such a way that the polarization state of the laser beam 104 produces a substantially equal superposition of the two eigenpolarization states of the polarizing beam splitter 150.

Figure 5B:
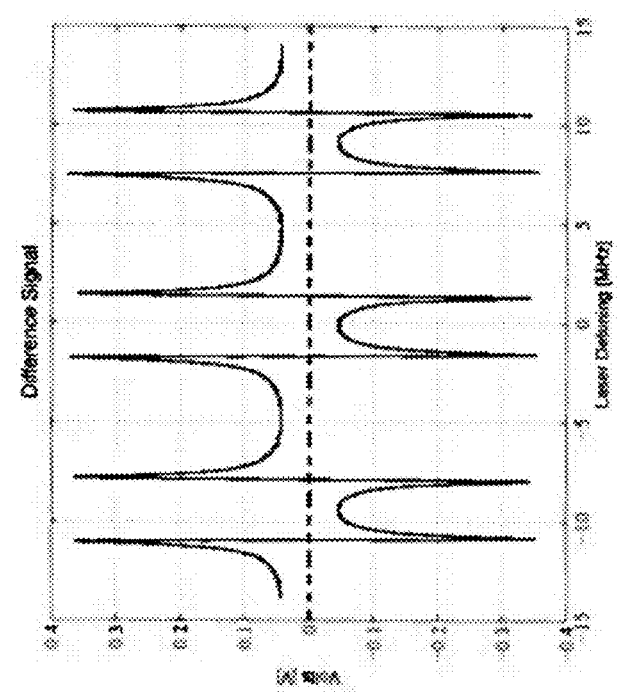
FIGS. 5A and 5B show a sum signal and a difference signal, respectively, produced by a system like the one shown in FIG. 1B.
Figure 5A:
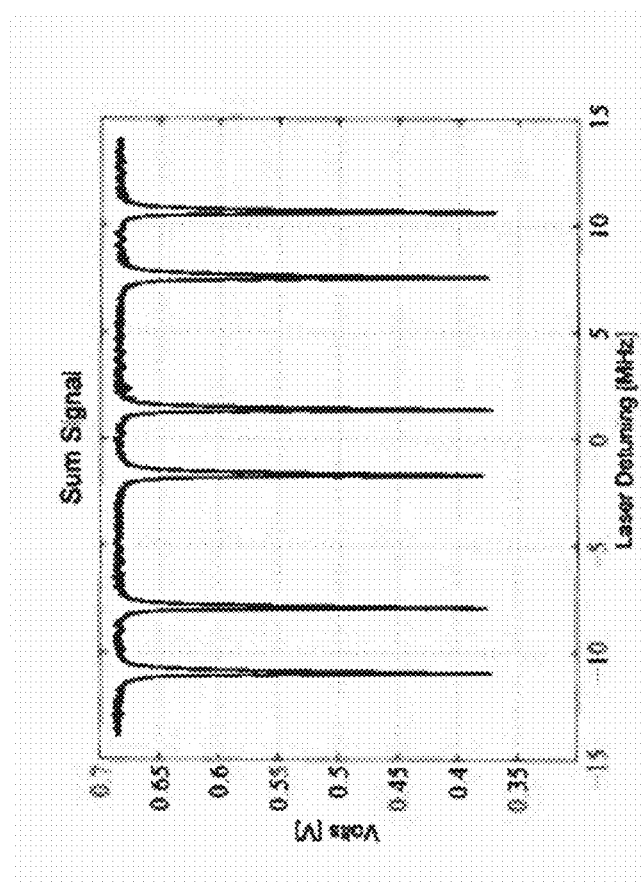

The two separated polarization components 106a and 106b can be monitored by two photodetectors 162a and 162b, respectively. The detected signals can then be sent to analog or digital electronics 170 to calculate their sum and/or difference. The sum signal 172 may be used as a reference for the adjustment of the first polarization controller 120 so as to make its output laser beam 103 an equal superposition of the two eigenpolarization states of the birefringent resonator 130. Generally, the sum signal 172 comprises a plurality of peaks (e.g., as shown in FIG. 5A). Adjusting the first polarization controller can change the relative amplitudes of the peaks. If each peak has substantially the same amplitude, then the laser beam 103 delivered by the first polarization controller 120 may be decomposed into an equal superposition of the two eigenpolarization states of the birefringent resonator 130.

The difference signal 174 may be used for at least two functions. The difference signal 174 can function as an error signal, which can be fed into a servo 180 that is operably coupled to the differential detector 160 and the laser 110 to adjust the frequency of the laser beam 102, completing a laser frequency stabilization feedback loop. Additionally, the error signal 174 can be sent to a servo 180 that can actuate on the resonator 130 to adjust the optical path length and change the resonant frequency of the resonator. While sweeping the laser frequency, the difference signal 174 can also be used as a reference to adjust the second polarization controller 140 so as to make the laser beam 105 an equal superposition of the two eigenpolarization states of the polarizing beam splitter 150. Generally, the difference signal 174 can also comprise a plurality of peaks (e.g., as shown in FIG. 5B), each of which has a respective amplitude. Equalizing the amplitudes of the peaks by tuning the second polarization controller 140 can help decompose the laser beam into an equal superposition of the two eigenpolarization states of the PBS and provide the correct phase difference between these states to produce an optimal error signal.

The laser source 110 in the system 100 can be a diode laser, a gas laser, a fiber laser, a non-planar ring oscillator Nd:YAG laser, a free-electron laser, or any other single-frequency laser. The laser source 110 may also be a frequency comb generator (e.g., a mode-locked laser) that can deliver a laser beam comprising a train of pulses that have substantially equal spacing in both the temporal domain and the frequency domain. One or more frequency components of the comb may be stabilized by the system 100.

Polarization Controllers

The two polarization controllers 120 and 140 may transform an arbitrary polarization into another arbitrary polarization. This can be achieved by a combination of waveplates, fiber coils, fiber squeezers, or any other suitable device with variable retardance. In one example, the polarization control 120 or 140 may comprise three independently rotatable waveplates arranged in series: a first quarter-wave plate, a half-wave plate, and a second quarter-wave plate.

In another example, the polarization controller 120 or 140 can be based on fibers and their birefringence induced by bending. In this example, fiber coils can replace waveplates to introduce different ellipticity into the incident light. The total retardation (amount of birefringence) experienced by a beam propagating in a fiber is generally proportional to the length of the fiber and inversely proportional to the square of the fiber bend radius. The fiber type may also contribute to the birefringence. Tuning these parameters can yield an effective retardation of, for example, a half wavelength or quarter wavelength, functionally similar to a half-wave plate or a quarter-wave plate, respectively. Three fiber coils can be positioned in a sequence to form a polarization controller, where the middle coil acts as a half-wave plate and the outer ones as quarter-wave plates. By adjusting the orientations of these three fiber coils, one can transform a given input state polarization at a fixed wavelength into an output state of any desired polarization.

In yet another example, the polarization controller 120 or 140 may be based on fiber birefringence induced by external stress. The controller may comprise a rotatable fiber squeezer and two fiber holding blocks. Mechanically compressing a cross-sectional axis of the fiber can create stress-induced birefringence within the fiber, enabling a variable and rotatable tuning just like a waveplate. The angle and retardation of the waveplate can be continuously and independently adjusted, which allows an arbitrary input polarization state to be converted to any desired output polarization state.

Resonators with Arbitrary and/or Unknown Birefringence

In operation, the birefringent resonator 130 introduces a phase difference between the two polarization components of the laser beam 103. When one polarization component undergoes resonance, its phase can change sharply, while the other polarization component changes little. This makes it possible to use one polarization component as a phase reference for the other polarization component.

In a resonator, light can travel multiple times before being coupled out of the resonator. After each round trip, the light returns to the same location in the resonator and can interfere with itself. The resonance condition of a resonator, without being bound by any theory or mode of operation, means light traveling in the resonator constructively interferes with itself. The resonance condition of the birefringent resonator 130 is satisfied when the optical path length of one round trip in the resonator is an integer multiple of the light wavelength. Satisfying the resonance condition can produce error signals of narrow width and therefore reduce laser frequency noise. Off-resonance operation may also be possible, if, for example, the accumulated phase difference between the two polarization components can reflect good information about the laser frequency.

In light of, but without being bound by, the above consideration, the birefringent resonator 130 in the system 100 may be a fiber ring resonator 200 (FIGS. 2A-2B) that comprises a fiber ring 210 and a coupler 220 or 230 depending on the coupling scheme. Birefringence in optical fibers, including controlled birefringence, can be induced by a variety of sources. Practically, fibers are not perfectly circularly symmetric. As a result, modes polarized in orthogonal directions may propagate with slightly different phase and group velocities. Furthermore, environmental factors such as bending, twisting, and anisotropic stress also produce birefringence in the fiber, the direction and magnitude of which keep changing with time due to changes in the ambient conditions such as temperature. These factors can all contribute to the birefringence of optical fibers.

On the other hand, controlled birefringence can be introduced by, for example, an intentionally designed elliptical core embedded in a circular cladding. The elliptical core of such fibers creates both geometrical anisotropy and asymmetrical stress in the core, introducing different propagation constants of the two fundamental modes polarized along the major axis and minor axis of the ellipse—one source of birefringence. Other fiber designs with controlled birefringence may include D-type fibers which are half or substantially half polished from a normal circular fiber and have a D-shape cross section, Polarization-maintaining AND Absorption reducing fiber (PANDA), bow-tie fibers which have a bow-tie-shaped region that applies mechanical stress and therefore introduces birefringence, and internal elliptical cladding (IEC) fibers. Furthermore, an external magnetic field may also induce birefringence, in a controlled manner, into optical fibers through the magneto-optical effect.

Note that even in the case of controlled birefringence, uncontrolled birefringence still exists and may be undesired in certain applications including fiber optic interferometric sensors and coherent optical communication systems. By contrast, the birefringent resonator 130 as in system 100 can take advantage of this otherwise detrimental unknown birefringence of optical fibers since the birefringence can be arbitrary. Therefore, random birefringence, controlled birefringence, or both can be utilized in the birefringent resonator 130. In one example, the birefringent resonator 130 comprises a single-mode fiber ring that is 20 meters long and has a refractive index of n=1.5 in the core. This resonator has a finesse of around 60 and a free spectral range (FSR) of around 10 MHz. This exemplary resonator can be easy to implement and cost-effective, especially for all-fiber systems because the alignment and mode-matching can be straightforward. In another example, additional birefringence can be introduced by applying mechanical stress, heat, or a magnetic field. Note that changing the birefringence may not change the slope or amplitude of the error signal. Rather, the slope and/or amplitude of the error signal can be changed by varying the finesse of the resonator, the free spectral range of the resonator, the input power, or the photodetector gain.

The fiber ring resonator 130 used in the system 100 can employ either a direct coupling scheme or cross coupling scheme. One factor that may be taken into account when choosing the coupling scheme can be the power coupling coefficient. For direct coupling, a smaller power coupling coefficient can result in higher finesse, while for cross coupling a smaller power coupling coefficient tends to generate lower finesse. Moreover, cross coupling can be constructed using a single length of an optical fiber without a splice point. Avoiding splice points may help obtain high finesse under otherwise same conditions. In practice, parameters that may be tuned in a fiber ring resonator to achieve satisfactory errors signals include but are not limited to fiber length, fiber diameter, the shapes of the fiber's core and cladding, the fiber's refractive indices, coupling efficiency, and insertion loss, among others.

The fiber ring as used in the birefringent resonator 130 may have a variable optical path length, which can be proportional to the fiber length. In operation, the resonant frequency of the birefringent resonator 130 can be tuned by adjusting the optical path length of the fiber. This can be achieved by, for example, stretching or compressing the fiber in the longitudinal direction or by changing the temperature of the fiber. As a result, depending on different practical applications, the laser frequency can be locked into different resonant frequencies using only one birefringent resonator 130.

Figure 3A:
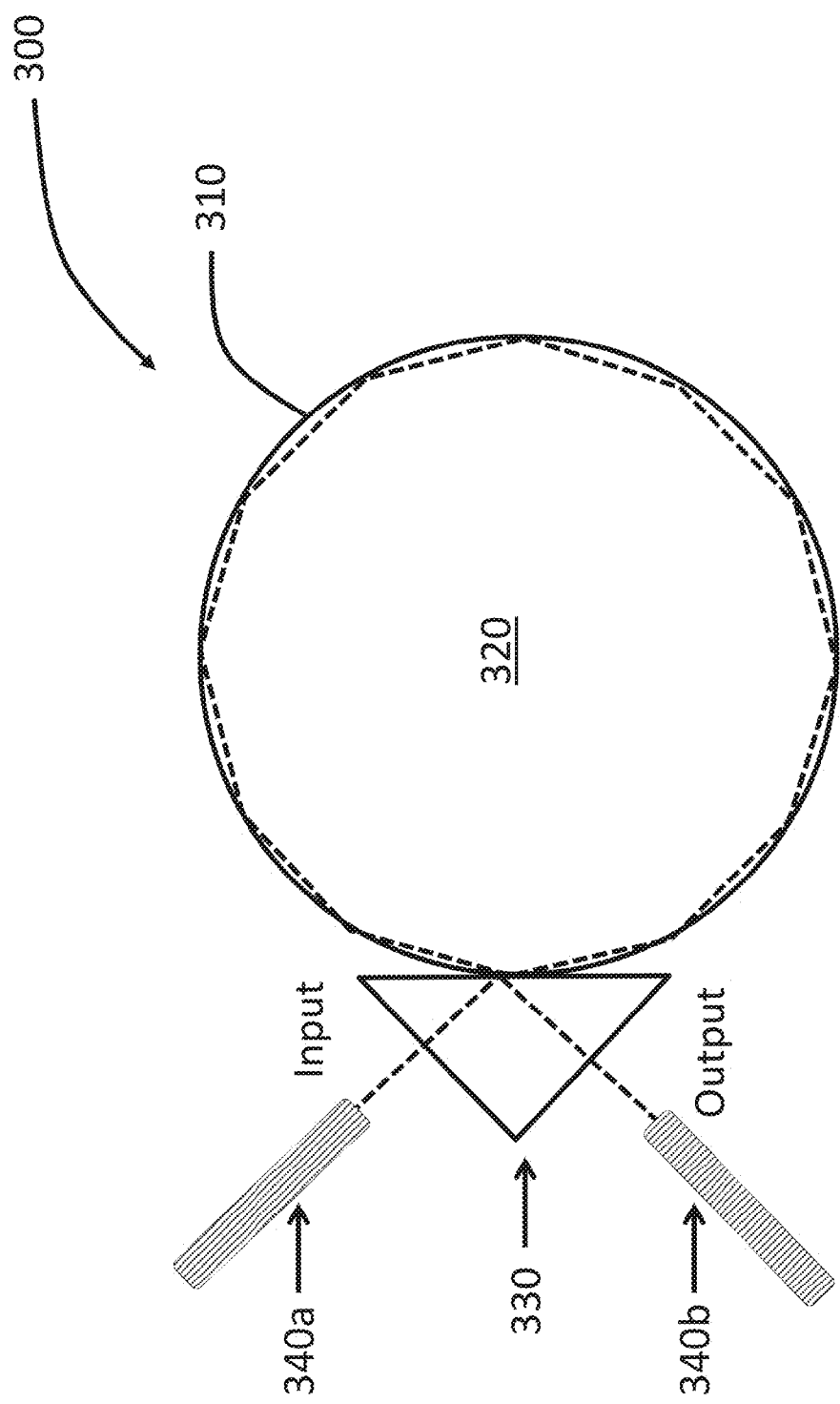
Figure 3B:
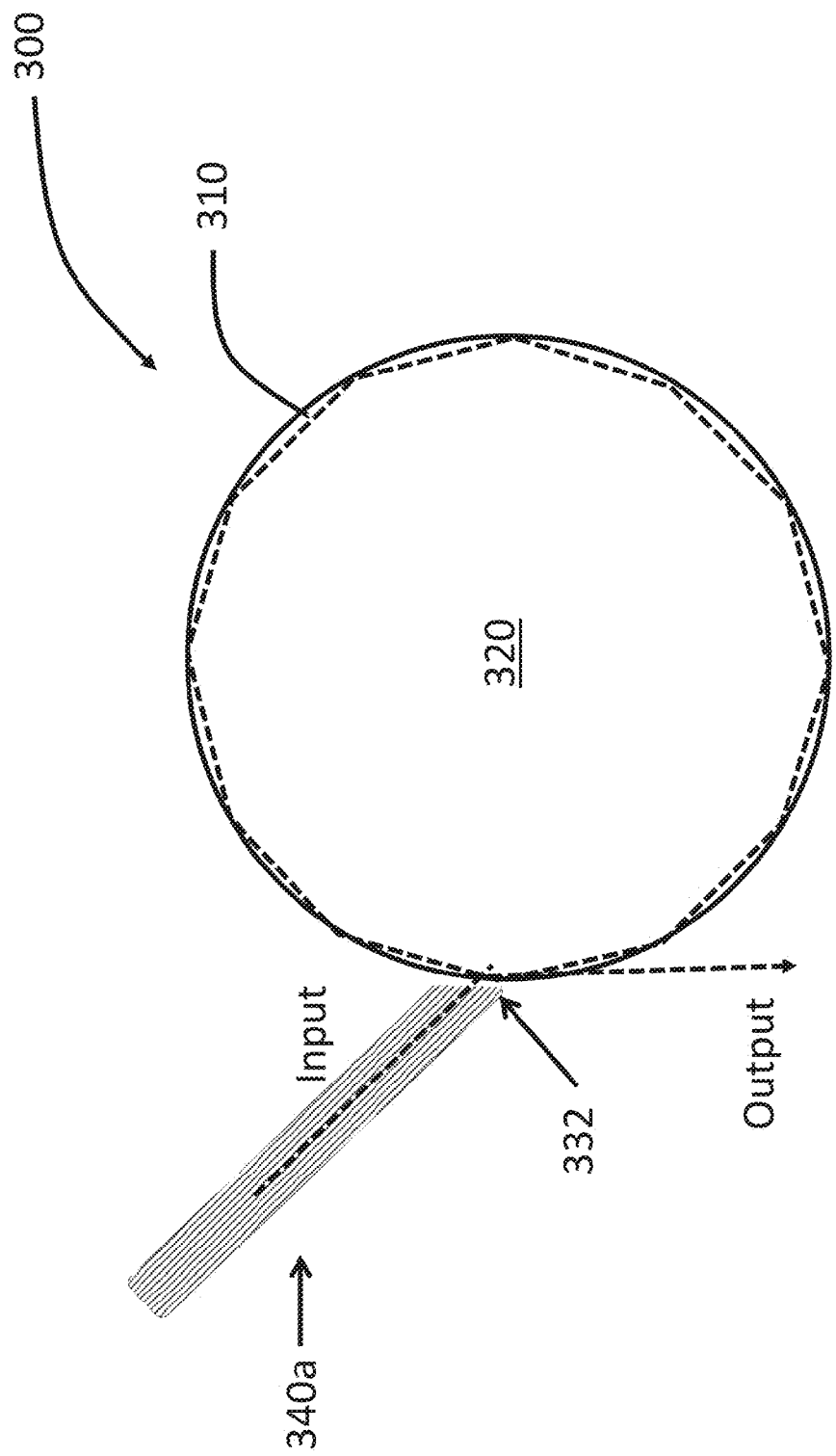

In another exemplary embodiment, the birefringent resonator 130 may comprise a Whispering Gallery Mode (WGM) resonator 300 as shown in FIGS. 3A-3C. WGM resonators are cavities that can support whispering gallery modes or waves, which can be, for example, specific resonances or eigenmodes of a wave field (e.g., optical waves, sound waves, and other electromagnetic waves, etc.) inside a given resonator with smooth edges. One example of WGM resonator may be a spherical cavity as shown in FIG. 3A. The WGM resonator can comprise a cavity 310 filled with a dielectric material 320. The cavity 310 can be defined by a wall, or simply the interface between the dielectric material 320 and the outside material (e.g., air or another dielectric material with a lower refractive index). The light resonating in the cavity 310 can be coupled into and out of the cavity through two fibers 340a and 340b, in combination with a coupler 330. If the light traveling inside the cavity 310 has an incident angle $\theta$>arc $\sin(n_2/n_1)$, where $n_1$ is the refractive index of the WGM resonator material 320 and $n_2$ is the refractive index of the surrounding material (often air), then total internal reflection can occur. Due to the spherical symmetry, all subsequent angles of incidence can be the same, and the light ray can therefore be trapped inside the cavity 310. The resonance condition can be satisfied when, after one roundtrip, light rays return to the same point and hence interfere constructively.

The WGM resonator may have various shapes, including, among others, cylindrical cavities, microspheres, fiber coils, micro-disks, micro-toroids, photonic crystal cavities, micro-capillaries, bottle resonators, and bubble resonators. The size of the WGM resonator may also vary across a wide range depending on, for example, the wavelength of the light resonating inside the cavity 310. A WGM resonator may have a diameter of tens of meters for acoustic waves. For optical waves, a WGM resonator may be millimeter-sized and can be produced by mechanical polishing, possibly followed by thermal annealing. It can also be micrometer- or even nanometer-sized and can be produced by nanofabrication, allowing highly compact integration with other devices.

The birefringence of the birefringent resonator 130 can originate from the dielectric material 320. Some commonly used materials in WGM resonators, including $SiO_2$, $CaF_2$ or $MgF_2$, have natural birefringence. Even if natural birefringence is not available, artificial birefringence may be introduced by mechanical stress, heating, or an electrical or magnetic field. Another way to introduce birefringence into the WGM resonator 300 can be placing a birefringent crystal (e.g. $BaB_2O_4$, $Be_3Al_2(SiO_3)_6$, $TiO_2$, SiC, $CaCO_3$, $LiNbO_3$, $Al_2O_3$, etc.) into the beam path of the light without disrupting the resonance condition. Yet another way to construct a birefringent WGM resonator 300 may be including metamaterials into the cavity 310. By introducing anisotropy when fabricating metamaterials, arbitrary birefringence can be created. For example, the anisotropy can be induced by stacking patterns of metamaterials.

The dielectric material 230 in the WGM resonator 300 can be substantially transparent to the light traveling inside the cavity 310. Due to minimal reflection losses associated with total internal reflection and potentially very low material absorption, WGM resonators can reach exceptionally high quality factors Q, e.g., up to $10^{11}$. In operation, high quality factors can lead to high finesse. As a result, even a small amount of birefringence in the dielectric material 320 may be sufficient to generate error signals that can be used for the frequency-stabilization feedback loop. Another benefit that can be derived from high Q factors can be the narrow resonance line, which can reduce laser frequency noise when used for laser frequency stabilization.

The WGM resonator 300 can be coupled into the laser frequency stabilization system 100 using any of several different methods. For example, FIG. 3A shows a WGM resonator that is coupled to the rest of the optical system through a coupler 330 that comprises a diamond prism, which can refract incident light into the cavity 310 and refract a portion of the resonating wave out of the cavity 310.

Both the input and output laser beam can be delivered by fibers 340a and 340b so as to provide a compact system.

FIG. 3B shows a WGM resonator in which the incident light is coupled into the cavity 310 by a fiber with a slant-cut facet 332. The slant cut optical fiber can function as a refractor that couples the light into and out of the cavity 310. FIG. 3C shows a coupling method using a tapered fiber, which can be produced by pulling a normal optical fiber when it is being heated. Light in the fiber 340a can be coupled into the WGM resonator via the evanescent field generated in the tapered region 330 of the fiber.

The resonant frequency of a WGM resonator may be tuned by adjusting the refractive index of the dielectric material 320 so as to change the optical path length within one round trip of the light traveling in the cavity 310. In practice, the refractive index may be changed by using different dielectric materials. External stress, heating, or an electric or magnetic field may also be applied to tune the refractive index of the dielectric material 320 that is already inside the cavity so as to enable the locking of laser frequencies to different resonant frequencies of the resonator, depending on specific situations. Another way to change the resonant frequency of a WGM may involve tuning the morphology of the cavity 310. For example, the shape or size of the cavity 310 may be adjusted such that the optical path length in one round trip changes accordingly.

Separation of the Arbitrarily Phase-Shifted Polarization Components

Separating the two polarization components of the laser beam 105 can be achieved by a variety of polarizing beam splitters (PBS). In one example, the PBS 150 can be as simple as a polarizer that reflects the s-polarized component while transmitting the p-polarized component, thereby separating the two components by directing them into two different directions. In another example, the PBS 150 may be a cube that comprises a pair of right angle prisms cemented together. The hypotenuse face of one prism can be coated with a multilayer dielectric material. In operation, when non-polarized light is incident upon the entrance face, it is separated into two polarized components that can be directed into two perpendicular directions and are polarized orthogonally to each other. When linearly polarized light is incident, it can be similarly divided into two components in a ratio depending upon the orientation of the polarization of the incident light.

Other technologies may also be employed to achieve polarization separation. In one example, the PBS may be a photonic crystal slab that has polarization-dependent dispersion properties so as to induce different propagation directions for different polarization components. In another example, the PBS may comprise a semiconductor metasurface, which can be an engineered structure with rationally designed, nanostructured building blocks that allow distinct responses to light, acoustic waves, and heat flows that are not attainable with natural materials. For instance, manipulating the spatial parametric variation of a sub-wavelength thin-film Si grating structure can enable polarization filtering properties.

In yet another example, an ultra-compact PBS can be designed on a silicon-on-insulator (SOI) platform using the localized surface plasmons (LSPs) excited by light of particular polarization. Nanoscale silver cylinders can be employed for polarization selection between two silicon waveguides of a directional coupler. The device can be designed such that the transverse-magnetic (TM) polarized light can excite LSPs and therefore can be coupled into the cross port of the directional coupler with a low insertion loss, while the transverse-electric (TE) polarization light is under restriction.

In yet another example, the PBS 150 can be based on air-hole periodic dielectric waveguides. In operation, parallel periodic dielectric waveguides can have different directional coupling properties of light in TE and TM polarizations, i.e., separating two polarization components into different directions. Furthermore, the performances of such PBSs can be insensitive to longitudinal alignment errors in the coupling region, which can be beneficial for device fabrication and practical application. In practice, it may also be beneficial to integrate the PBS 150 into a fiber or fiber-coupled device, therefore enabling a compact all-fiber laser frequency stabilization system.

Differential Detection of the Phase-Shifted Polarization Components

The differential detector 160 in the laser frequency stabilization system 100 can comprise, in one example, two photodetectors 162a and 162b and analog or digital electronics 170. Each of the photodetectors receives a respective polarization component delivered by the PBS 150, and the two detected signals can then be combined in the electronics 170 to calculate their sum and difference. The electronics 170 can be, for example, operational amplifiers, or any other devices known in the art.

The differential detector may further comprise amplifiers or filters to adjust the intensities of the signals. For example, one or more electronic amplifiers may be disposed between the photodetector 162a/162b and the electronics 170 to change the amplitude(s) of the electrical signal representing the power of the detected polarization components. Similarly, optical filters or attenuators may be disposed before the photodetectors 162a/162b to tune the absolute and relative optical intensities of the two polarization components. Radio-frequency filters may also be used after the photodetectors 162a/162b to reduce or eliminate, for example, noise in the detected signals.

Servo-Based Frequency Control

In operation, the servo 180 can take the error signal generated by the differential detector 160 and act correspondingly to change the output frequency of the laser to match the resonant frequency of the birefringent resonator 130. (In another embodiment, the servo 180 can be coupled to the birefringent resonator 130 for tuning the resonance of the birefringent resonator 130 with respect the output frequency of the laser.) Frequency tuning can be achieved through several different ways, including adjusting the laser's gain material, adjusting the laser's cavity length, tuning the passband of an intra-cavity filter, and shifting the frequency of the laser's output using an external shifter.

Adjusting the gain material can shift the frequency of maximum gain in the gain profile and correspondingly shift the output frequency. Specifically, the gain material can be influenced by, among other things, heating, cooling, drive current amplitude, and mechanical strain. For example, output frequency of a laser diode can be tuned by changing the drive current of a heater or cooler that is in thermal contact with the laser region. The drive current flowing through the laser diode itself can also influence the output frequency. A mechanical strain can be applied to, for example, a Nd:YAG crystal to shift the emission frequency via piezoelectric actuators.

Piezoelectric actuators may also be used to adjust the cavity length of a laser so as to tune the output frequency. The piezoelectric actuator can be operably coupled to one or more of the mirrors that define the cavity and change their position according to a control signal (e.g., an error signal in the system 100) to change the cavity length. In operation, the piezoelectric actuator may be coupled to the end mirror of a cavity to simplify the alignment. Or the piezoelectric actuator may adjust the output coupler to change both the output frequency and direction of the laser.

Intra-cavity filters, which can have a pronounced loss minimum at a certain adjustable frequency, may cause the laser to operate at a desired frequency by introducing higher losses at other frequencies in the gain profile. In one example, the intra-cavity filter can comprise an etalon (e.g. Fabry-Perot interferometer) or a birefringent filter (e.g., Lyot filter), which can be tuned, according to a drive signal, to adjust the frequency at which minimum loss (maximum transmission) occurs. In another example, the intra-cavity filter can comprise a pair of prisms in combination with a movable aperture in between. The first prism disperses the laser beam into different directions according to its spectral content, and the movable aperture selects which spectral component(s) to transmit while blocking the others, thereby achieving frequency selection for the laser source. In yet another example, the intra-cavity filter may comprise a single prism and an end mirror. Each orientation of the end mirror corresponds to a frequency for which the cavity is well aligned. Frequency tuning can be realized by tilting the end mirror. In yet another example, a volume Bragg grating, which can comprise a periodic variation of the refractive index, can be employed inside a laser cavity to adjust the laser frequency. For each incident angle, only a certain frequency that satisfies the Bragg condition can have maximum reflectivity. As a result, by tilting the Bragg grating, one can adjust the incident angle of the laser beam upon the grating and therefore select a particular frequency to dominate in the cavity.

Figure 4A:
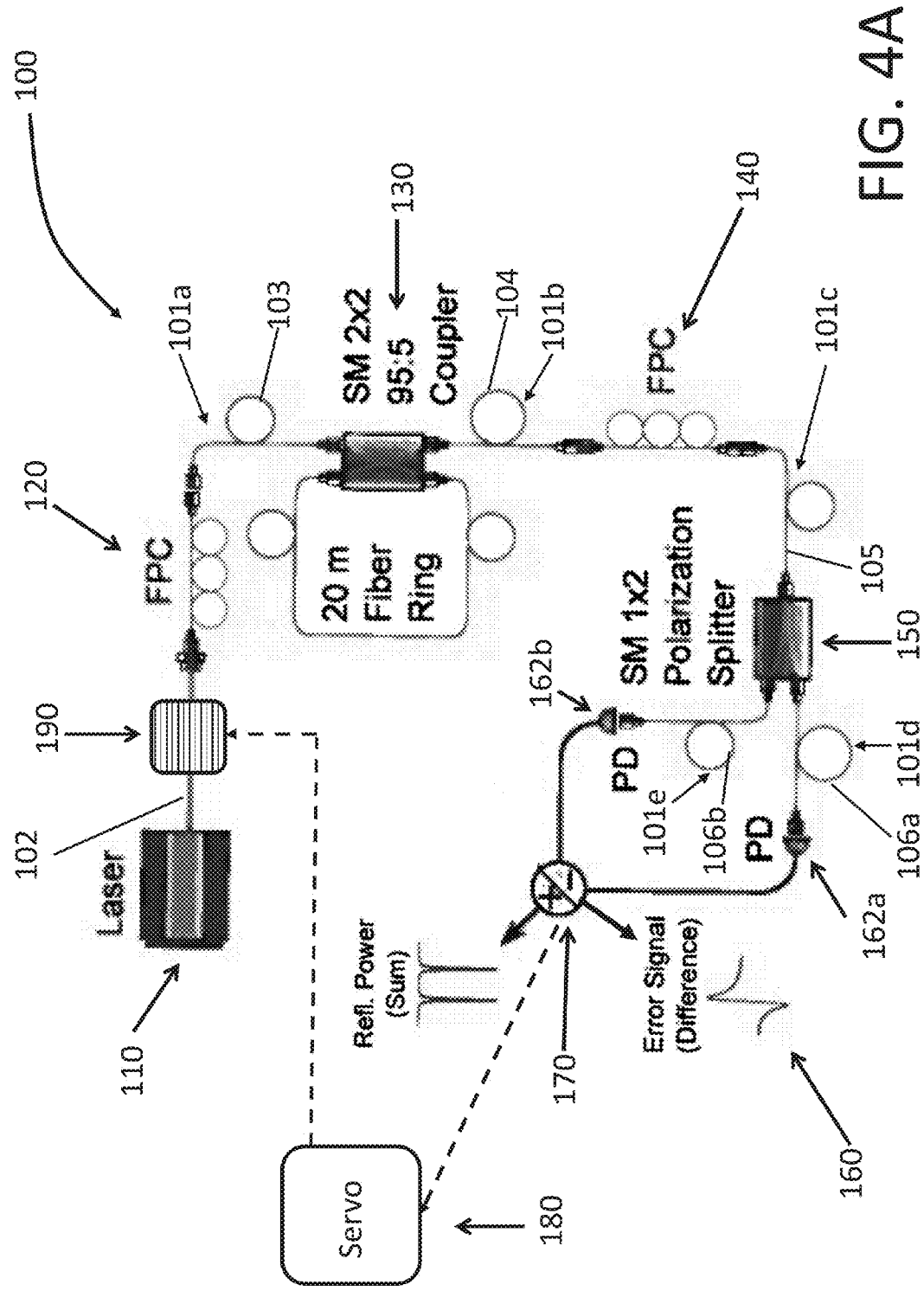
FIG. 4A shows a laser frequency stabilization system with a control loop feeding back to a frequency shifter, according to another exemplary embodiment.

The output frequency of the laser 110 may also be adjusted by an external frequency shifter 190, as shown in FIG. 4. The frequency shifter 190 can be, for example, an acousto-optic modulator (AOM), which can shift the laser frequency using sound waves introduced by piezoelectric transducers in response to a control signal. The sound waves can create a periodic variation of expansion and compression that change the index of refraction, which can scatter the incident light and change its frequency in a way similar to Bragg diffraction. Other possible frequency shifters may include rotating scattering discs, Kerr cells, rotating diffraction gratings, piezoelectric elements, fiber optic modulators, and laser diode current modulation, among others.

Figure 4B:
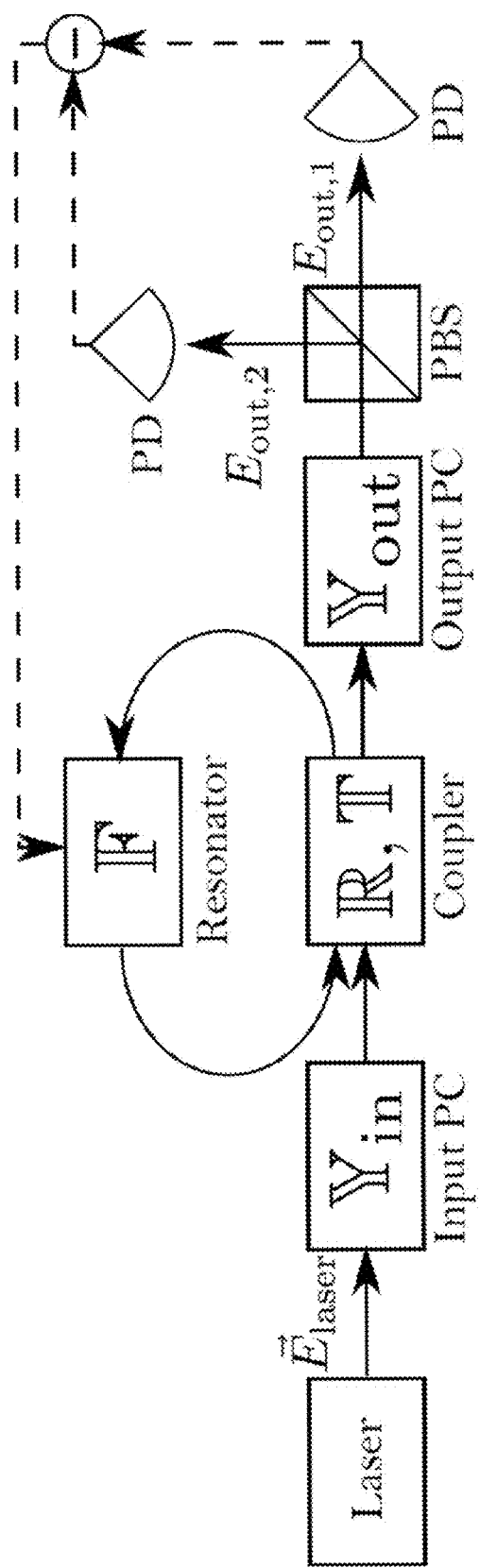
FIG. 4B shows a laser frequency stabilization system with a feedback loop coming back to the reference resonator, according to another exemplary embodiment.

FIG. 4B shows a block diagram of a system used to lock a resonator to a laser frequency. The generated signal from the detector comes back to the reference resonator, in addition to or instead of coming back to the laser or an external frequency shifter and adjusts the resonator resonant frequency according to the frequency of the laser. In addition, the birefringent reference resonator can be tuned accordingly to accommodate different applications. For instance, external conditions (e.g., temperature or humidity) may change during the operation of the laser source, and it may be beneficial to adjust the frequency to which the laser source is to be locked.

In operation, the servo 180 may also be disabled, and the error signal generated by the differential detector 160 can be used as a reference parameter for operating the laser. For example, one may use the error signal to monitor the laser frequency and see whether it is in certain range. The servo 180 may also be controlled manually by an operator, who may adjust the operation of the laser, for example, based on other parameters such as room temperature, humidity or output power. The system 100 may further comprise a display to visualize the error signal and facilitate its usage.

Demonstration of Frequency Stabilization Using an Arbitrarily Birefringent Resonator FIG. 5A and FIG. 5B show a sum signal and a difference signal of the two polarization components recorded by the differential detector 160, respectively. Even far off resonance, the signal may be nonzero, enabling quick recovery for large frequency jumps outside the linear region. Additionally, there are two error signals within one free spectral range (FSR) with opposite slopes, each of which can be used for frequency locking into the birefringent resonator 130, therefore simplifying the locking setup.

Figure 6:
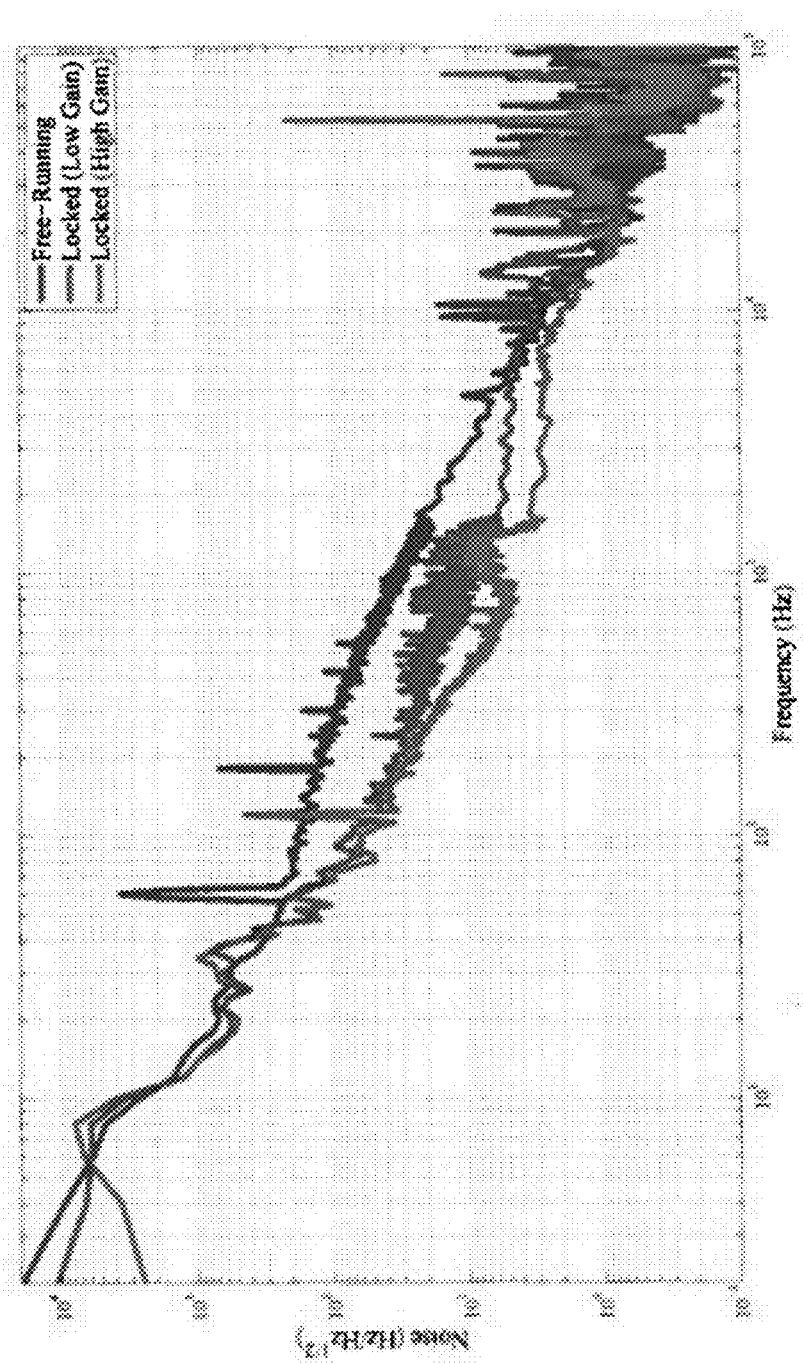
FIG. 6 shows exemplary experimental spectra of frequency noise of a non-planar ring oscillator Nd:YAG laser without frequency stabilization (upper trace), with low-gain frequency stabilization (middle trace), and with high-gain frequency stabilization (bottom trace).

FIG. 6 shows a frequency noise spectrum of a non-planar ring oscillator Nd:YAG laser stabilized by a system like the one shown in FIG. 1B. The spectrum also includes the free-running noise spectrum of the same laser for comparison. The stabilization reduces the frequency noise below its free running level. Note that the y axis is in logarithmic scale so the decrease in noise level is, in certain regions, more than one order of magnitude. In this example, the frequency stability was limited only by the optical path length noise of the resonator.

Note that although the system 100 is described in relation to laser frequencies in an optical region, it may also find application in other spectral ranges. For example, the systems can be employed to stabilize or monitor a microwave source. Furthermore, the application of the system 100 may also be extended to shorter wavelengths such as stabilizing a free electron laser, which is a powerful tool used from engineering to health care. In this example, the birefringent resonator 130 may comprise crystal resonators. For instance, crystalline silicon or pyrolytic graphite crystals can be used to form resonators to store X-rays, which normally have low reflectivity in most materials. Frequency tuning of a free electron laser can be realized by adjusting the energy of the electron beam traveling in the wiggler.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teaching(s) is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the coupling structures and diffractive optical elements disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (e.g., of designing and making the coupling structures and diffractive optical elements disclosed above) outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory media or tangible computer storage media) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention, need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys a relationship between the fields. However, any suitable mechanism may be used to establish a relationship between information in fields of a data structure, including through the use of pointers, tags or other mechanisms that establish a relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of or" "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A system to stabilize a frequency of a laser beam in a first polarization state emitted by a laser source, the system comprising:
    a ring resonator having an arbitrary and/or unknown birefringence, in optical communication with the laser source, to transmit the laser beam;
    a first polarization converter, in optical communication with the ring resonator, to convert the first polarization state of the laser beam into a second polarization state that is a superposition of a first eigenpolarization of the ring resonator and a second eigenpolarization of the ring resonator;
    a reflector, in optical communication with the ring resonator, to reflect the laser beam from the ring resonator so as to convert the second polarization state into a third polarization state determined by a detuning of the frequency of the laser beam from a resonance frequency of the ring resonator;
    a second polarization converter, in optical communication with the reflector, to convert the laser beam from the third polarization state into a fourth polarization state that is a substantially equal superposition of eigenpolarizations of a polarizing beam splitter (PBS); and
    the PBS, in optical communication with the second polarization converter, to resolve the laser beam into a first component and a second component having a power difference corresponding to the detuning of the laser beam from the resonance frequency of the ring resonator; and
    a detector, in optical communication with the PBS, to detect the power difference so as to stabilize the frequency of the laser based at least in part on the power difference.

2. The system of claim 1, wherein the ring resonator comprises a fiber ring, the fiber ring having an optical path length that can be varied so as to tune the resonant frequency of the ring resonator.

3. The system of claim 1, wherein the ring resonator comprises a whispering gallery mode resonator.

4. The system of claim 3, wherein the whispering gallery mode resonator has at least one tunable property that can be varied to adjust a resonant frequency of the whispering gallery mode resonator.

5. The system of claim 1, wherein the detector comprises a subtractor to determine the power difference.

6. The system of claim 1, further comprising:
    a laser servo, operably coupled to the detector and the laser source, to adjust the frequency of the laser beam based at least in part on the power difference.

7. The system of claim 1, further comprising:
    a resonator servo, operably coupled to the detector and the ring resonator, to adjust an optical path length of the ring resonator based at least in part on the power difference.

8. The system of claim 7, wherein the resonator servo is configured to adjust the optical path length of the ring resonator by a distance corresponding to at least one free spectral range of the ring resonator.

9. A method of stabilizing a frequency of a laser beam emitted by a laser source in a first polarization state, the method comprising:
    A) converting, with a first polarization converter, the first polarization state of the laser beam into a second polarization state that is a superposition of a first eigenpolarization of a ring resonator having an arbitrary birefringence and a second eigenpolarization of the ring resonator;
    B) reflecting the laser beam from the ring resonator so as to convert the second polarization state into a third polarization state determined by a detuning of the frequency of the laser beam from a resonance frequency of the ring resonator;
    C) converting, with a second polarization controller, the laser beam from the third polarization state into a fourth polarization state that is a substantially equal superposition of eigenpolarizations of a polarizing beam splitter (PBS);
    D) transmitting the laser beam through the PBS so as to resolve the laser beam into a first component and a second component having a power difference corresponding to the detuning of the laser beam from the resonance frequency of the ring resonator; and
    E) stabilizing the frequency of the laser based at least in part on the power difference.

10. The method of claim 9, further comprising:
    transmitting the laser beam through the ring resonator to induce a phase difference between a third component of the laser beam in the first eigenpolarization of the ring resonator and a fourth component of the laser beam in the second eigenpolarization of the ring resonator.

11. The method of claim 10, further comprising:
adjusting an amplitude of the third component to be substantially equal to an amplitude of the fourth component.

12. The method of claim 10, wherein the ring resonator comprises a fiber ring and further comprising coupling the laser beam into the fiber ring.

13. The method of claim 10, further comprising adjusting an optical path length of the ring resonator to tune the resonant frequency of the ring resonator.

14. The method of claim 13, wherein adjusting the optical path length of the ring resonator comprises at least one of:
changing a length of the ring resonator;
changing a temperature of the ring resonator;
applying a stress to the ring resonator; or
applying an electric field to the ring resonator.

15. The method of claim 10, further comprising coupling the laser beam into a whispering gallery mode of the ring resonator.

16. The method of claim 10, further comprising:
generating the laser beam with at least one of a solid state laser, dye laser, diode laser, fiber laser, gas laser, or free electron laser.

17. The method of claim 9, wherein A) further comprises:
adjusting the first polarization converter so as to make the second polarization state a substantially equal superposition of the first eigenpolarization of the ring resonator and the second eigenpolarization of the ring resonator.

18. The method of claim 9, wherein A) comprises:
A1) summing the first component and the second component to produce a sum signal having a plurality of resonant peaks, each peak in the plurality of resonant peaks having a respective amplitude and a respective center frequency; and
A2) scanning the frequency of the laser beam and adjusting the first polarization controller so as to substantially equalize the respective amplitudes of the peaks in the plurality of resonant peaks.

19. The method of claim 9, wherein the third polarization state is an unknown polarization state.

20. The method of claim 9, wherein C) comprises:
C1) providing a second polarization controller that is in optical communication with the ring resonator and the PBS;
C2) determining a difference signal based on the first component and the second component, the difference signal having a plurality of spectral features; and
C3) scanning the frequency of the laser beam and adjusting the second polarization controller based on the difference signal to achieve the substantially equal superposition of eigenpolarizations of the PBS.

* * * * *